(12) United States Patent
Guttmann

(10) Patent No.: US 6,171,357 B1
(45) Date of Patent: Jan. 9, 2001

(54) AIR FILTER

(75) Inventor: Baruch Guttmann, Bnei Brak (IL)

(73) Assignee: ECI Telecom Ltd., Petah Tikva (IL)

( * ) Notice: Under 35 U.S.C. 154(b), the term of this patent shall be extended for 0 days.

(21) Appl. No.: 09/224,782

(22) Filed: Jan. 4, 1999

(51) Int. Cl.[7] .................................................. B01D 59/50
(52) U.S. Cl. ............................................ 55/385.7; 55/471
(58) Field of Search ............................. 55/385.6, 385.7, 55/471

(56) References Cited

U.S. PATENT DOCUMENTS

| 4,553,499 | * | 11/1985 | Crone | 118/428 |
|---|---|---|---|---|
| 4,559,249 | * | 12/1985 | Arigaya | 428/36 |
| 5,431,974 | * | 7/1995 | Pierce | 428/45 |
| 5,506,047 | * | 4/1996 | Hedrik | 428/307.7 |
| 5,680,294 | * | 10/1997 | Stora | 361/695 |
| 6,018,125 | * | 1/2000 | Collins | 174/35 R |

* cited by examiner

Primary Examiner—Chester T Barry
(74) Attorney, Agent, or Firm—Wolf, Greenfield & Sacks, P.C.

(57) ABSTRACT

A combined air filter and EMI shield including an air filter formed of a conducting metal thread mesh. Preferably, a mesh size of the air filter is selected in accordance with electromagnetic interference and air flow requirements.

15 Claims, 1 Drawing Sheet

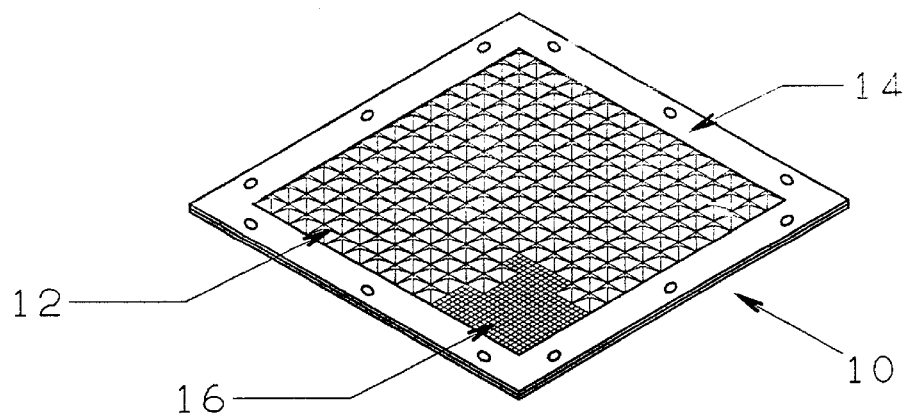
FIGURE 1
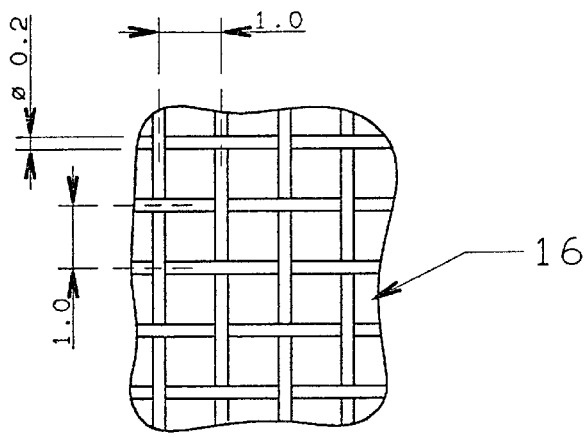
FIGURE 2-A
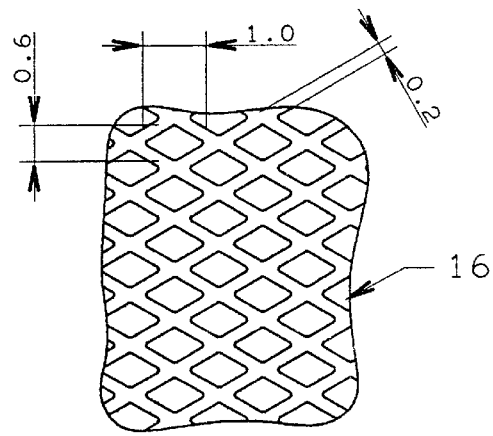
FIGURE 2-B
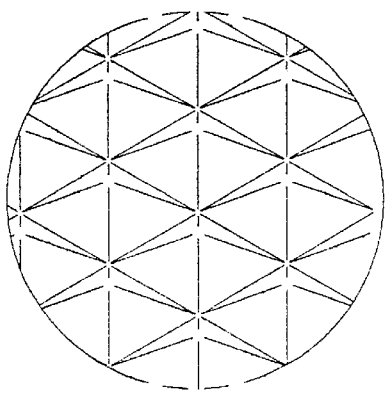
FIGURE 3
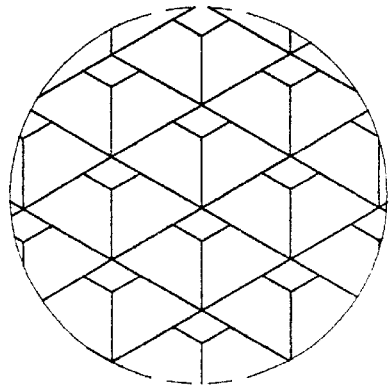
FIGURE 4

AIR FILTER

FIELD OF THE INVENTION

The present invention relates to air filters in general and, in particular, to air filters with electromagnetic interference protection properties.

BACKGROUND OF THE INVENTION

Much electronic equipment is required to operate in environments where the air can pick up dust, lint, and other airborne impurities. If these contaminants are permitted to enter the cooling air passages, they might plug up the openings and reduce the air flow, causing overheating of the electronics. To prevent this from happening, air filters are often used. These air filters typically include a layer of demembraned polyurethane, paper, metal, or other plastic material woven or knitted and formed in an egg-crate or repeated pyramid shape.

In addition, in many telecommunications applications, the equipment also requires electromagnetic interference (EMI) protection, also known as RF shielding. These EMI protection devices generally include a metallic material mounted in a frame and inserted in the electronic enclosure.

When both characteristics of dust screening and RF filtration are required, two separate elements are installed, a metallic RF filter and an air filter to trap particulates. Alternatively, these devices can be formed of, for example, layers of corrugated aluminum mesh, which are so aligned to act as an air filter, or layers of crimped or expanded aluminum alloy. In this case, several layers of metallic material of differing aperture size, shape and spacing are required to be mounted in a frame for insertion into the electronic enclosure.

These prior art devices are relatively large in volume, need high maintenance, and are costly to produce.

Accordingly, there is a long felt need for a simple air filter with EMI protection properties.

SUMMARY OF THE INVENTION

According to the present invention, there is provided a combined air filter and EMI shield including an air filter formed of a conducting metal thread mesh.

According to one embodiment of the invention, the metal thread is woven or knitted to form the filter.

According to a preferred embodiment of the invention, the air filter is formed into an egg-crate or repeated pyramid shape.

Further according to a preferred embodiment, the mesh size of the air filter is selected in accordance with electromagnetic interference and air flow requirements.

There is also provided, in accordance with the present invention, a method for providing EMI shielding to an enclosure including the steps of forming a combined air filter and EMI shield of a conducting metal thread mesh, and mounting said combined air filter in the enclosure.

BRIEF DESCRIPTION OF THE DRAWINGS

The present invention will be further understood and appreciated from the following detailed description taken in conjunction with the drawings in which:

FIG. 1 is a perspective view of an air filter constructed and operative in accordance with one embodiment of the present invention;

FIGS. 2A and 2B are schematic illustrations of sections of exemplary raw material for forming an air filter according to the present invention;

FIG. 3 is a perspective view of a portion of an air filter constructed and operative in accordance with one embodiment of the present invention; and FIG. 4 is a perspective view of a portion of an air filter constructed and operative in accordance with another embodiment of the present invention.

DETAILED DESCRIPTION OF THE INVENTION

The present invention relates to air filters having EMI protection properties for electronic enclosures, particular for telecommunications equipment. The air filters are formed of metal thread knitted or woven into a mesh which is shaped into an egg crate or repeated pyramid shape. The mesh size is selected in accordance with the EMI requirements and the air flow requirements in the particular application.

Referring now to FIG. 1, there is shown a perspective view of an air filter 10 constructed and operative in accordance with one embodiment of the present invention. Air filter 10 includes an air filter element 12 mounted in a frame 14. Frame 14 is connected to the ground plane (not shown), for operation of the EMI shield. As can be seen, air filter element 12 includes a single layer or multi-layer of metallic mesh which serves both to filter particulates from the air and to provide RF shielding or EMI protection. Multi-layer mesh is utilized in applications where the user wants tighter filtering, and the number of layers and the grid size are selected for optimization of the air filtering and the EMI protection.

Air filter element 12 is formed of a mesh 16, illustrated schematically in FIGS. 2A and 2B. Mesh 16 can be any screen type material made from a conducting metal, such as plated copper, stainless steel or aluminum. Preferably, the conducting metal is woven or knitted from the conducting metal thread by standard knitting techniques (as shown in FIG. 2A) or by expanded metal techniques (as shown in FIG. 2B). In the example in FIGS. 2A and 2B, mesh 16 is formed of 0.2 mm wire, with 1 mm spacing.

The mesh undergoes a cold forming process to shape it into an egg crate (FIG. 3) or repeated pyramid (FIG. 4) shape. These shapes, or similar shapes having a depression to maximize surface area, are required because the concavity functionality of every small egg crate or pyramid contributes to collecting the airborne contaminants. This effect is cumulative, according to the level of particulates. Using the example of FIGS. 2A and 2B, an air filter would typically be formed with a pyramid height of 1.3 mm and a 4 mm square base.

The mesh size of the finished air filter is selected by analyzing the air filtration requirements and the EMI requirements. The EMI shield grid (mesh) is based on the wavelength of the expected frequency. The formula is $\lambda = c/f$, where $\lambda$ is wavelength, c is the speed of light, and f is the frequency. Using $c = 3 \times 10^8$ meters per second, for a 10 GigaHerz signal, the wavelength is 0.3 meters, or 3 centimeters. Since it is preferred that the hole size be significantly less than this result, in the present case, the mesh size is selected as $1/20$ or $1/30$ of this size, i.e., 1 mm. If this is sufficient for air filtration, in the selected location, this size will be used. If a tighter weave is needed for the air filter, the mesh size is made smaller, to suit the particular application. Generally, the size of the mesh will require a forced air flow for efficient operation.

It is a particular feature of the present invention that the resulting air filter is washable and reusable, resulting in low maintenance costs. When used in forced air applications, the pressure drop across the filter is progressive, increasing more as more pollutants are trapped.

It will be appreciated that the invention is not limited to what has been described hereinabove merely by way of example. Rather, the invention is limited solely by the claims which follow.

What is claimed is:

1. A combined air filter and EMI shield comprising an air filter formed of a conducting metal thread mesh defining a plurality of depressions.

2. The combined air filter as claimed in claim 1, wherein said filter is formed of woven metal thread.

3. The combined air filter as claimed in claim 1, wherein said filter is formed of knitted metal thread.

4. The combined air filter according to claim 1, wherein said mesh defines an egg-crate shape.

5. The combined air filter according to claim 1, wherein said mesh defines a repeated pyramid shape.

6. The combined air filter according to claim 1, wherein a mesh size of the air filter is selected in accordance with electromagnetic interference and air flow requirements.

7. The combined filter according to claim 6, further comprising a frame wherein a single layer of said air filter is mounted.

8. The combined filter according to claim 6, further comprising a frame wherein multiple layers of said air filter are mounted.

9. A method for providing EMI shielding to an enclosure comprising the steps of:

forming a combined air filter and EMI shield of a conducting metal thread mesh, said mesh defining a plurality of depressions; and mounting a single layer of said combined air filter in the enclosure.

10. The method according to claim 9, wherein said metal thread is woven to form the filter.

11. The method according to claim 9, wherein said metal thread is knitted to form the filter.

12. The method according to claim 9, further comprising the step of forming said mesh into a repeated pyramid shape, before said step of mounting.

13. The method according to claim 9, further comprising the step of forming said mesh into an egg crate shape before said step of mounting.

14. A combined air filter and EMI shield comprising an air filter formed of a conducting metal thread mesh wherein said mesh defines an egg-crate shape.

15. A combined air filter and EMI shield comprising an air filter formed of a conducting metal thread mesh wherein said mesh defines a repeated pyramid shape.

* * * * *